United States Patent
Hu et al.

(10) Patent No.: US 6,390,020 B1
(45) Date of Patent: May 21, 2002

(54) DUAL FACE SHOWER HEAD MAGNETRON, PLASMA GENERATING APPARATUS AND METHOD OF COATING SUBSTRATE

(75) Inventors: Ing-Feng Hu, Midland, MI (US); Jeffrey R. Dykhouse, Murrieta, CA (US)

(73) Assignees: The Dow Chemical Company, Midland, MI (US); Metroline Surfaces, Inc., Corona, CA (US)

( * ) Notice: Subject to any disclaimer, the term of this patent is extended or adjusted under 35 U.S.C. 154(b) by 0 days.

(21) Appl. No.: 09/509,722

(22) PCT Filed: Sep. 28, 1998

(86) PCT No.: PCT/US98/20247

§ 371 Date: Mar. 30, 2000

§ 102(e) Date: Mar. 30, 2000

(87) PCT Pub. No.: WO99/17335

PCT Pub. Date: Apr. 8, 1999

Related U.S. Application Data
(60) Provisional application No. 60/060,652, filed on Oct. 1, 1997.

(51) Int. Cl.[7] .......................... C23C 16/00; C23C 14/00; H05H 1/00
(52) U.S. Cl. ............... 118/723 E; 156/345; 204/298.34
(58) Field of Search ................. 118/723 E, 723 ER; 156/345; 204/298.34

(56) References Cited

U.S. PATENT DOCUMENTS

| | | | |
|---|---|---|---|
| 4,818,358 A | | 4/1989 | Hubert et al. ............... 204/298 |
| 5,286,297 A | * | 2/1994 | Moslehi et al. .......... 118/723 E |
| 5,298,587 A | | 3/1994 | Hu et al. ....................... 528/10 |
| 5,320,875 A | | 6/1994 | Hu et al. ..................... 427/493 |
| 5,433,786 A | | 7/1995 | Hu et al. ..................... 118/723 |
| 5,494,712 A | | 2/1996 | Hu et al. ..................... 427/489 |
| 5,518,831 A | | 5/1996 | Tou et al. ..................... 429/42 |
| 5,627,435 A | | 5/1997 | Jansen et al. ........... 315/111.21 |
| 5,718,967 A | | 2/1998 | Hu et al. ..................... 428/216 |
| 5,795,452 A | * | 8/1998 | Kinoshita et al. ....... 204/298.37 |
| 5,900,584 A | | 5/1999 | Hu ............................. 427/489 |
| 5,993,598 A | | 11/1999 | Hu ............................. 156/345 |
| 6,076,483 A | * | 6/2000 | Shintani et al. ...... 118/723 MA |

FOREIGN PATENT DOCUMENTS

EP        0428161       5/1991

* cited by examiner

*Primary Examiner*—Gregory Mills
*Assistant Examiner*—P. Hassanzadeh (57) ABSTRACT

An electrode is provided which can improve the efficiency and quality of plasma-generated coatings in a plasma enhanced chemical vapor deposition coating device. The electrode comprises dual shower head faces containing in the preferred mode a plurality of magnets which are aligned so that the poles of the magnets face in the same direction to thus generate two magnetron faces for each set of magnets.

2 Claims, 5 Drawing Sheets

DUAL FACE SHOWER HEAD MAGNETRON, PLASMA GENERATING APPARATUS AND METHOD OF COATING SUBSTRATE

This application claims the benefit of U.S. Provisional Application Ser. No. 60/060,652, filed Oct. 1, 1997.

This invention relates to plasma-generating devices. More specifically, this invention relates to shower head magnetron-type plasma-generating devices containing dual shower heads and capable of sustaining plasmas of more uniform density than plasmas generated by previously known magnetron-type plasma-generating devices and taking less space in a plasma-generating device.

Magnetrons have been known in the art for a long time and have been used, for example, in etching, surface modification, and plasma-enhanced chemical vapor deposition ("PECVD"). PECVD devices are also known in the art. Examples of PECVD devices can be found in U.S. Pat. Nos. 5,298,587; 5,320,875; 5,433,786; and 5,494,712, (collectively "Hu et al."). Shower head magnetrons are also known. In these, the reaction gases are transferred through and out of one face of the magnetron in a manner similar to a shower head used to disperse water as a spray. One embodiment of a shower head magnetron is taught in the above cited U.S. patents.

Magnetrons are a class of cold cathode discharge devices generally used in a diode mode. In a plasma-generating device, a plasma is initiated between a cathode and an anode at pressures in the m Torr range by the application of a high voltage, which can be either dc or rf. The plasma is sustained by the ionization caused by secondary electrons emitted from the cathode due to ion bombardment which are accelerated into the plasma across the cathode sheath. What differentiates a magnetron cathode from a conventional diode cathode Is the presence of a magnetic field. The magnetic field in the magnetron is oriented such that a component of the magnetic field is parallel to the cathode surface. The local polarity of the magnetic field is oriented such that the ExB drift paths of the emitted secondary electrons form a closed loop. Due to the increased confinement of the secondary electrons in this ExB drift loop, compared to a dc or rf diode device, the plasma density is much higher, often by an order of magnitude or more, than a conventional rf or dc diode plasma. The result of the high plasma density and its proximity to the cathode is a high current, relatively low voltage discharge.

Hu et al. teach a method of forming a flexible corrosion and abrasion resistant coating onto a substrate surface. In one embodiment of the method taught in Hu et al., a PECVD method, preferably using a shower head magnetron cathode, is used to initiate the polymerization reaction of an organo-silicone compound and oxygen employing an adequate power density, in the presence of a substrate having a suitable surface to cause the polymerizabon product of the plasma process to adhere to the substrate surface. In Hu et al., a single face shower head magnetron utilizing magnets having sufficient strength to provide at least 100 gauss is used.

It is also known in the art that when using a magnetron in a process to coat a substrate such as in a PECVD process or sputtering process, it is difficult to obtain a coating of uniform thickness and quality. One aspect of quality is uniform chemical composition of the coating both in thickness and width directions. In some prior art techniques, to get a coating of uniform thickness and quality the substrate must be moved relative to the electrodes. This is especially true for large substrates. Moving the substrates relative to the electrodes can cause a decrease in throughput.

The present invention allows for mom uniform (thickness and quality) coatings to be obtained more easily than do devices of the prior art, especially on large substrates.

In one aspect, the present invention is a shower head electrode for a magnetron plasma-generating apparatus containing multiple magnets wherein dual opposite parallel faces of the electrode comprise a shower head design, such that reactant gases can be discharged into a reaction chamber from at least two surfaces. The magnets also provide magnetic fields to both faces of the electrode. Preferably the multiple magnets are positioned internally in the shower head such that like magnetic poles of said magnets all face in the same direction and serve to provide magnetic fields on each face of the electrode. In the preferred mode, the magnets are placed in a position and distance from each other such that each magnet produces a magnetic field between the opposite magnetic poles on the same magnet. Each magnetic field has a component parallel to the surface of the electrode. electrodes of the preferred mode of the invention have a higher number of closed loop ExB drift paths per number of magnets than electrodes where each magnetron is composed of three magnets, where the center magnet has the pole opposite to each outside magnet. By aligning all magnets so that the same poles face in the same direction, each magnet becomes a separate magnetron. Electrodes of the preferred mode are capable of producing a more uniform plasma across the surface of an electrode. In addition, in the preferred mode the electrodes produce plasmas of greater effective volume than electrodes where the magnets are arranged with opposite poles facing each other. According to the present invention, large numbers of magnets (that is, two or more) can be aligned in various configurations so as to create large electrodes capable of producing large, more uniform, plasmas.

In another aspect, the present invention is an improved plasma-generating device utilizing at least one dual face electrode of the present invention. In still another aspect, is a plasma-generating device containing at least one shower head dual face electrode of the present invention facing, with a space between and opposite each face, a shower head electrode having only one shower head face. In another mode, two shower head electrodes having only one shower head face are placed in a plasma-generating device having placed between the two at least two dual face shower head electrodes of the invention. In another embodiment, more than one dual face electrode is disposed between two single face electrodes.

In yet another aspect, the present invention is an improved method of forming a plasma and an improved method for coating various substrates.

In one embodiment of the present invention, the electrode is a planar electrode comprising two shower head faces essentially parallel to each other and facing in opposition directions and at least one magnet, preferably more than one magnet, positioned such that like poles of said magnets are in a single geometric plane parallel to the geometric plane of the planar electrode and the polarity of said magnets is perpendicular to the geometric plane of the planar electrode, each magnet producing a magnetic field having a component parallel to the geometric plane of the electrode.

A specific embodiment of the shower head electrode having no backing plate for the magnets comprises a pair of face plates each having a plurality of holes for transporting a gas therethrough in a shower manner. The facing plates are electrically insulated from each other and form an interior space therebetween. A means for supporting a multiple of magnets in said interior space where said magnets are electrically insulated from said face plates and from each other is provided. A means for introducing a gas into the interior space of said magnetron and out through said holes in said face plates in a controlled manner with respect to said flow rate through each of said holes, commonly called a manifold system, is also provided. A means for supporting said face plates and said magnets to form an interior gas chamber formed by said face plates containing in said gas chamber said magnets, and also for providing a means for introducing a gas from outside said chamber into said chamber and out of said plurality of holes is used. In a preferred mode, the spray head electrode also is provided with heat exchange means for cooling or heating said electrode. In a more preferred mode, the magnets are aligned so that each magnet has the same pole facing in the same direction.

Figure 1:
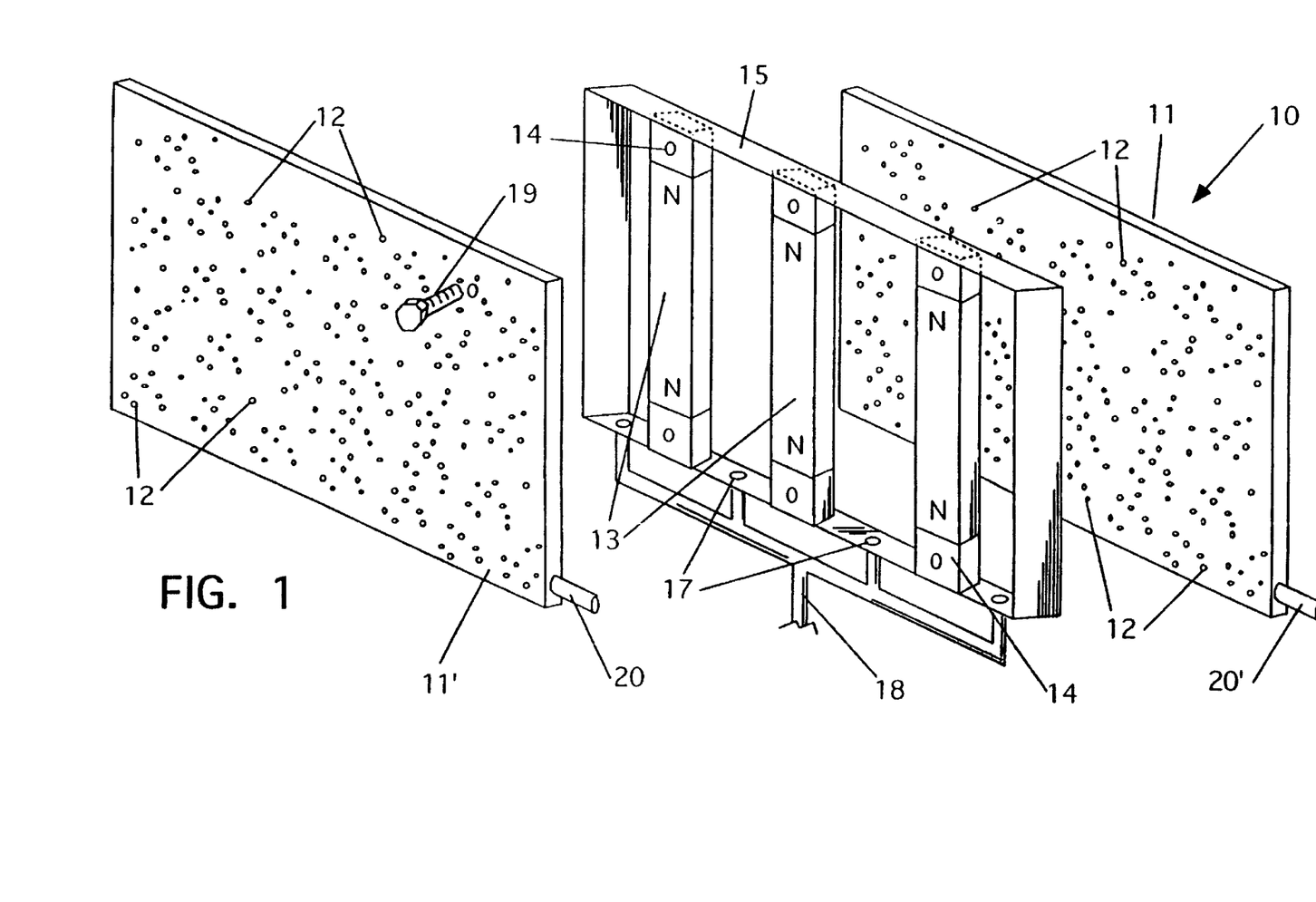
FIG. 1 is an exploded view of one embodiment of the dual face shower head electrode of the present Invention.

FIG. 1 illustrates one embodiment of the dual face shower head electrode 10 comprising face plates 11 and 11' containing a plurality of holes 12, for transferring gas from inside the electrode to the outside. Magnets 13, in this embodiment, three, with like magnetic poles facing the same direction are supported in the interior of the electrode. Insulating means 14 are provided for electrically insulating the magnets from a frame 15 and the face plates 11. The insulation of the magnets 13 from the face plates 11 and 11' can be accomplished through an adequate air gap or the magnets can be covered with for, example, an Insulating material such as a plastic resin, or ceramic material. A frame 15 is provided for holding the magnets and face plates in an electrcally insulated manner from the face plates and magnets. The frame is provided with inlet holes 17 for introducing a gas through the frame and into the interior of the electrode. A gas conduit 18 is connected to holes 17 for introducing reactant and inert gases to the interior of the electrode. Fastening means 19, such as bolts, are provided for assembling the electrode in a gas tight manner except for the holes 12 and inlet holes 17. The electrode 10 forms a gas tight space inside the electrode for distributing a gas from the conduit 18, holes 17 and out through holes 12 in the face plates. Electrical connectors 20 and 20' are independently attached to each of the face plates 11 and 11' for directing power independently to each face plate. Alternatively, one face can be powered and the other grounded.

Figure 2:
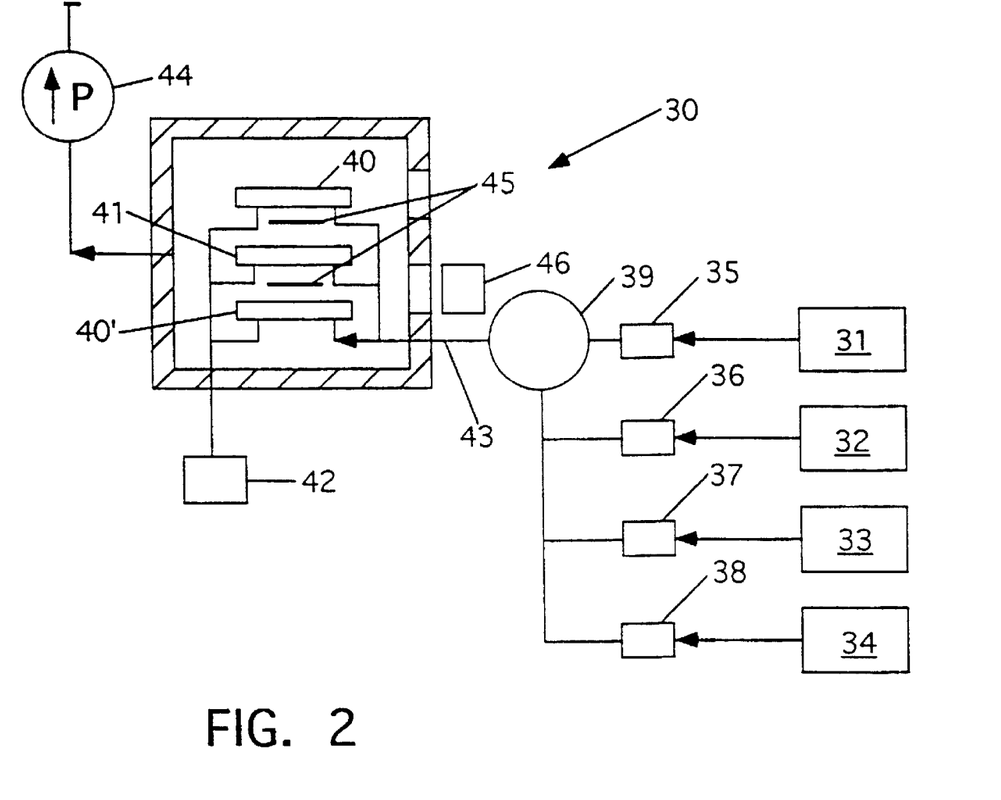
FIG. 2 is a schematic view of one embodiment of a plasma apparatus of the present invention.

FIG. 2 illustrates one embodiment of a plasma-generating apparatus of the present invention in which an electrode of the present invention can be effectively utilized. The apparatus comprises a vacuum reactor vessel 30 into which gaseous reactants can be introduced from sources 31. 32, 33, and 34 through mass and vapor flow controllers 35, 36, 37, and 38. If desired, the different gases and vapors from the indicated sources can be mixed in a mixer 39 prior to introducing them into the reactor vessel.

Disposed in the reactor vessel 30 are at least 3 magnetron electrodes 40, 40' and 41. The center electrode 41 is a dual face shower head electrode of the present invention. Electrodes 40 and 40' can be single face. shower head electrodes with the shower face directed toward the dual face electrode 41, or they can be plate electrodes. Substrates 46 to be treated are placed between the electrodes 40 and 41 and 40' and 41, such as by being suspended on hangers or conveyor belts. Each magnetron electrode 40, 40' and 41 in this embodiment is connected to a variable frequency power source 42. As an alternative, separate power sources can be provided to power each electrode. The substrates are attached to an anode which can be advantageously grounded through the reactor vessel walls. Alternatively, the substrates can be floated (no electrical connection) in the plasma-generating device wherein another portion of the apparatus is grounded, such as one face of the dual race electrode of the invention. Gaseous reactants are dispersed into the interior of the vessel and out through the shower head electrodes from gas supply line 43. The reactor vessel 30 can be advantageously Connected to a vacuum pump 44 for evacuating the vessel 30. Optionally, the reactor vessel could be equipped with a monitoring device 46, such as an optical monitor and/or mass spectroanalyzer, for process control.

As indicated, the electrode 41 is a dual shower head electrode of the present invention. Electrodes 40 and 40' may be single face shower head electrodes with the shower head facing electrode 41. Preferably all electrodes have the magnets therein aligned so that the poles of the magnets in each electrode face the same direction. However, it is not necessary that all the electrodes contain the magnets arranged in this manner. If only one electrode contains the preferred magnet arrangement, then preferably the dual face electrode 41 contains the preferred magnet arrangement. Because of the elimination of backing plates in the electrode of the invention, the electrodes take up less space inside the reactor vessel 30 making room for more parts to be treated.

In operation, the reactor vessel 30 is first evacuated by means of the vacuum pump 44 prior to introducing gaseous reactants (for example, organosilicone and oxygen) and inert gases, if any, to the vessel at a predetermined flow rate through supply line 43. When the flow rate of the gases becomes constant, the variable frequency power 42 is turned on to a predetermined value to generate a plasma which causes the reactants to form a film on, or modify the surface on the substrates 45 located in the space between the electrodes.

Figure 3:
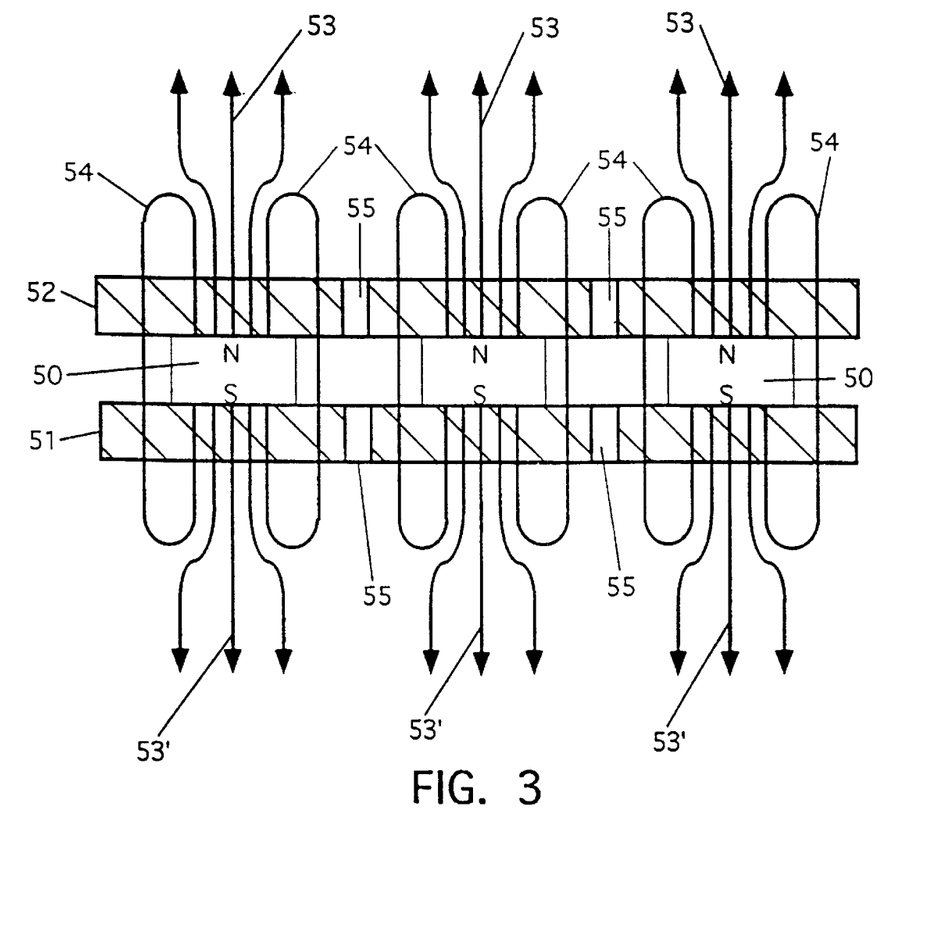
FIG. 3 is a view of an alignment of magnets useful In an electrode of the present invention showing magnetic fields.

One of the preferred features of the present invention is that each magnetic pole of each magnet in an electrode of the present invention produces a magnetic field with the opposite magnetic pole on the same magnet. This is depicted in FIG. 3, wherein the north pole of each magnet 50 forms a magnetic field 54 with the south pole of the same magnet. Each magnet 50 has a component of the magnetic field 54 which is parallel to the electrode surface. Each magnet that forms a magnetic field with the opposite magnetic pole of the same magnet creates at least one closed loop ExB drift path. In this embodiment, the electrode is shown with two shower head face plates 51 and 52 which define gas ports 55. One of the advantages of the dual face shower head electrode of the invention is that one set of magnets provide two electron faces (side 51, and 52), thus reducing the number of magnets needed with any reaction vessel and also reducing the space taken up by the electrodes in that reaction vessel. Also, by this arrangement, a portion of the magnetic field 53 is repelled because of the like poles facing the same direction, thus increasing the effective volume of the plasma above each face of the electrode.

Thus, magnets in electrodes of the preferred embodiment of the present invention are configured such that each magnet creates its own closed loop ExB drift path(s).

Preferably, this is done by aligning the magnets so that like magnetic poles are all facing in substantially the same direction, as shown in FIG. 3. By substantially the same direction, it is meant that like magnetic poles of all magnets are facing in the same direction relative to the surface of the electrode. Thus, although the electrode depicted in FIG. 3 is a planar electrode, it is envisioned that the electrode could be curved.

When the magnets are aligned so that their like magnetic poles are facing in substantially the same direction, the magnets can be positioned in close proximity of each other without having any of the magnets forming magnetic fields with any of the other magnets placed near it. Thus, even when magnets are placed in close proximity to each other, each magnet still creates its own closed loop ExB drift path(s).

Because the magnets are placed in close proximity with each other so that each magnet maintains its own dosed loop ExB drift path(s), electrodes of the present invention enjoy the benefit of having more dosed loop ExB drift paths per electrode surface area. This increased number of closed loop drift paths per electrode surface area results in a more uniform plasma than plasmas produced using magnetic confined type electrodes of the prior art. It has also been visually observed that plasmas generated using electrodes of the present invention diffuse farther away (thus creating greater effective volume) from the electrode surface in the space between the electrodes than plasmas generated using electrodes of the prior art. Although it is not definitively known exactly why this behavior is observed, it is believed that a portion of each magnetic field is repelled away from the electrode surface by the like magnetic poles on the electrode surface, as depicted in FIG. 3, magnetic field 53. It is also believed that these portions of magnetic field result in a portion of the plasma to be produced further from the electrode surface than would be possible if the magnets were positioned with alternating polarity, thus the greater effective volume.

Figure 4:
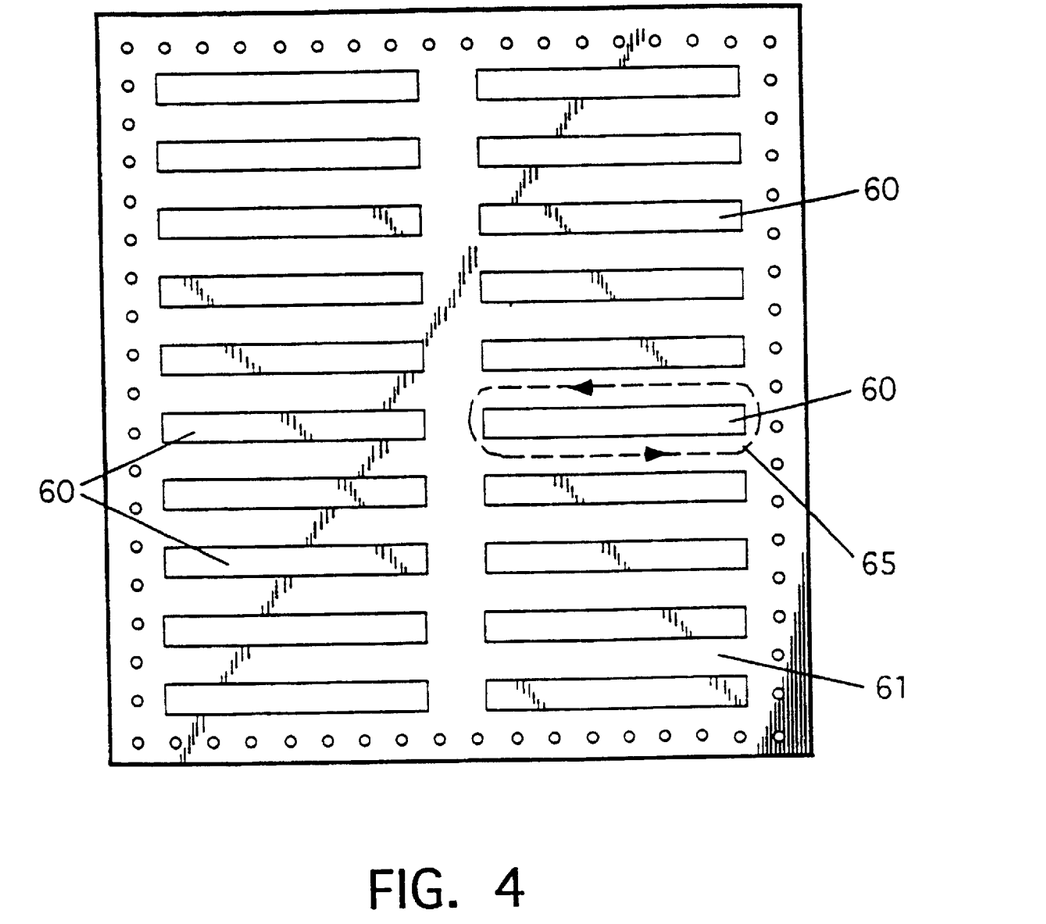
FIG. 4 is a view of another alignment of magnets useful in an electrode of the present invention.

Large electrodes of the present Invention can be created by configuring large numbers of magnets, all having like magnetic poles facing in substantially the same direction. For example, FIG. 4 shows how the magnets can be arranged inside a planar dual face shower head magnetron electrode of the present invention containing two rows of magnets 60. One face plate 61 is shown in this FIG. 4. Even larger electrodes can be produced by increasing the number of magnets in each row, or by adding more rows of magnets, or by arranging separate electrodes next to each other in a plasma-generating apparatus.

When bar magnets are utilized according to the teachings of the present invention, as shown in FIG. 4, each magnet 60 creates a single closed loop ExB drift path 65.

Figure 5:
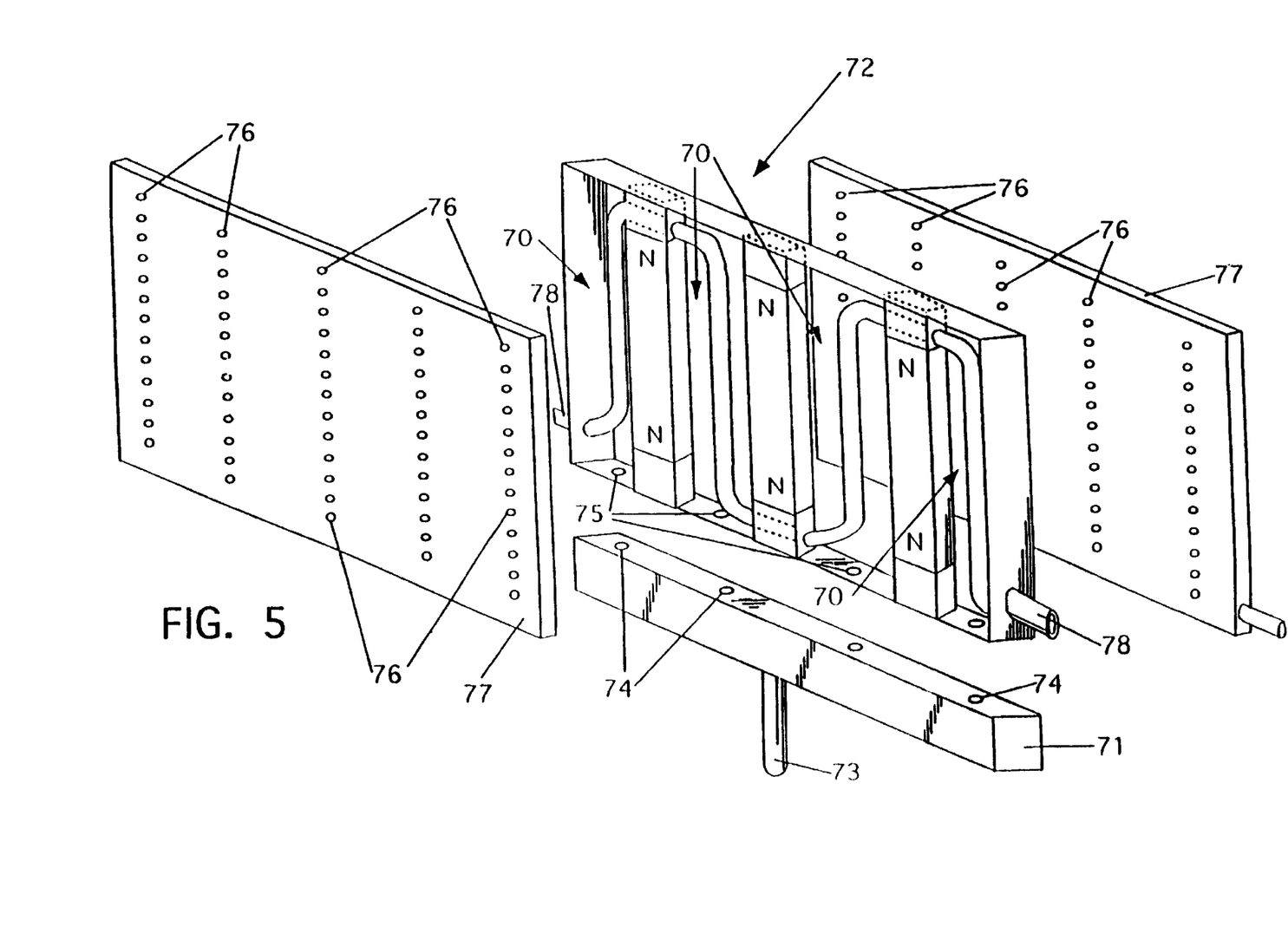
FIG. 5 is an exploded view of another embodiment of the dual face shower head electrode of the invention.

Another preferred embodiment of the invention is depicted in FIG. 5 and comprises the basic electrode design of FIG. 1 wherein the gas inlet 18, holes 17, space inside the electrode and exit holes 12 in the face plates are designed to create a gas manifold distribution system, whereby the gas exits from the face plates at substantially the same flow rate. Higher quality uniform coatings can be prepared by plasma reactions when such gases are evenly distributed into the plasma-generating apparatus 30. One embodiment to achieve this is shown in FIG. 5.

In this embodiment, the construction of FIG. 1 is refined so that each magnet, when the electrode is in a gas sealed closed position, is in electrical isolated contact with each of the interior surfaces of each face plate to form individual chambers 70. Across the bottom (or the top if desired) of the electrode is placed a first gas manifold means 71 connected to gas conduit 73. The manifold defines gas ports 74 which align with each of the chambers 70 through the plurality of holes 75 for exiting gas from the interior of the electrode through the holes 76 in the face plates 77.

The size of the manifold, exit ports from the manifold, size of chambers 70 and size of ports through the face plates are designed such that over a range of desired gas pressure from the inlet conduit 73 the gas will be distributed through the interior and out of exit ports in a manner such that it exits from the exit ports 76 at substantially the same flow rate. The design and sizes will depend on the size of the electrode and desired How rate and can be easily determined by those skilled in the art.

In still another embodiment, the basic embodiment of FIG. 1, as shown in FIG. 5, is modified to include heat exchange means 78. Simple hollow tubes can be arranged in the interior of the electrode to introduce cooling and/or heating medium as desired. For plasma reactions involving substrates which are sensitive to heat, for example, certain plastics, a cooling medium, such as cool water can be introduced. For other reactions, it may be desirable to actually introduce heat into the system. This can be achieved by introducing a heated medium through the tubes 78 or by substituting a heating element for the tube, such as an electrical resistance heating element.

The embodiment of the invention can include one or more of the embodiments previously discussed. Thus, the basic embodiment of FIG. 1 can be modified to use magnets wherein the poles are all arranged in the same direction, the manifold gas inlet system can be utilized and/or the heat exchange means can be incorporated.

The magnets utilized in the preferred embodiment of the electrode of the present invention, when the magnetic poles face in the same direction, should not be positioned so close to each other so as to prevent one magnetic pole of the magnet from producing a magnetic field with the opposite magnetic pole of the same magnet. If the magnets are positioned too close to each other, they may behave as a single magnet. There is no critical limitation as to how far apart the magnets may be positioned. However, as magnets are positioned farther apart, their corresponding closed loop ExB drift paths are farther apart and the resulting plasma produced will be less uniform than a plasma produced when the magnets are positioned closer together. A distance between magnets adequate for a given application can be determined without undue experimentation.

Wider bar magnets will produce a larger gap in the center of the corresponding closed loop ExB drift path. Larger gaps in the closed loop ExB drift paths also result in the production of a less uniform plasma. Thus, it is generally more desirable to utilize relatvely narrow bar magnets. However, if the magnets utilized In electrodes of the present invention are too narrow, then the closed loop ExB drift path also will be too narrow, making the plasma increasingly difficult to initiate. A magnet width adequate for a given application can be determined without undue experimentation.

Electrodes of the present invention can be advantageously utilized with the teachings of U.S. Pat. Nos. 5,298, 587; 5,320,875; 5,433,786; and 5,494,712 to produce improved PECVD devices and methods of forming plasmas, and methods of forming coatings and or treatment of surfaces of various substrates. For example, another embodiment of the present invention is a plasma-generating device comprising: a) at least three electrodes, wherein one of said electrodes is the dual face shower head electrode containing two or more magnets, each magnet having two opposite magnetic poles, said magnets positioned such that like magnetic poles of said magnets are all facing in substantially the same direction, each magnetic pole of each magnet producing a magnetic field with the opposite magnetic pole on the same magnet, each magnetic field having a component parallel to the electrode surface, the magnets having sufficient strength to generate at least 100 gauss on the electrode surface. The plasmagenerating device is further depicted in FIG. 2 as described hereinabove. Gaseous reactants are injected through at least the electrode as defined in FIG. 1, wherein the reactants are directed substantially through the magnetic fields established on both faces of the dual face shower head electrode. Yet another embodiment of the present invention is a method of providing an abrasion resistant coating onto the surface of a substrate employing plasma enhanced chemical vapor deposition of an organosilicone monomer gas in a plasma reaction zone and oxygen gas, comprising the steps of: a) plasma polymerizing the organosilicone monomer in the presence of excess oxygen employing a power density within the range of $10^3$ to $10^6$ J/Kg in the presence of the substrate; and b) conducting the oxygen and organosilicone monomer gases in a direction which is essentially perpendicular to the substrate surface and through a magnetic field of at least 100 gauss, which is contained essentially in a zone adjacent to the plasma zone and into the plasma reaction zone, wherein the magnetic field of at least 100 gauss is produced by a dual face shower head electrode, as defined hereinbefore, preferably containing two or more magnets, each magnet having two opposite magnetic poles, said magnets positioned such that like magnetic poles of said magnets are all facing in substantially. the same direction, each magnetic pole of each magnet producing a magnetic field with the opposite magnetic pole on the same magnet, each magnetic field having a component parallel to the electrode surface.

The electrode and plasma generating devices of the invention can be utilized in many plasma deposition processes to treat and/or coat the surface of various substrates such as brass fixtures, plastics such as polycarbonate glazing, flat panel displays, with silicon and other inorganic-based coatings, such as those taught in the Hu et al. patents referred to hereinbefore.

EXAMPLES

Deposition of $SiO_xC_yH_z$ was carried out according to the teachings of U.S. Pat. No. 5,433,786 except tat the deposition was carried out in a box equipped with a magnetron of he present invention and two electrodes having only one shower face. Each electrode was a lanar electrode having dimensions of 30 inches (76.2 cm) by 144 inches (365.76 cm). Each electrode was constructed of 4 segments, each segment having dimensions of 30 inches (76.2 cm) by 36 inches (91.44 cm). Each segment was constructed by arranging 33 bar magnets forming 11 columns where each column contained 3 magnets abutting each other to form essentially a single magnet on a frame made of aluminum. Each of the magnets in the column was 24 inches (60.96 cm) long, and 0.5 inch (1.27 cm) thick. The width was 0.75 inch (1.9 cm). The magnets in each column were placed 2.44 inches (6.19 cm) apart. Each magnet had a surface field of 1 kilogauss. The magnets were obtained from Midwest Industries. On the outside magnetrons, each magnet was placed such that the not pole of each magnet faced away from a backing plate composed of ⅟₁₆ inch (0.1524 cm) thick soft iron sheet. The face of the electrode was formed of 318 inch (0.939 cm) thick aluminum sheet (header plate). The electrodes were placed in the PECVD chamber in parallel 22 inches (55.88 cm) apart. The center electrode was a dual face electrode, without a backing plate. Utilizing these three electrodes, the PECVD device generated uniform plasma conditions over an area approximately 30 inches (76.2 cm) by 144 inches (365.76 cm) using power sources to provide a power density of approximately $8.64 \times 10^7$ J/Kg. Brass parts were coated with a $SiO_xC_yH_z$ coating as follows.

Approximately 500 pre-cleaned substrates, consisting primarily of polished brass door hardware, brass test coupons, and glass slides were attached to fifty 8-inch (20.32 cm) diameter by 32-inch (81.28 cm) long racks and suspended between the center double-sided electrode and the two single-sided electrodes. Electrode spacing was 22 inches (55.88 cm) center to center. Racks were rotated at approximately 1 RPM to provide uniform coating thickness for parts on all sides of each rack.

The coating chamber was evacuated to a pressure of $1 \times 10^{-4}$ Torr before introducing process gasses. Gas flows were 150 sccm $O_2$ and 100 sccm Ar. Gasses were introduced continuously for three minutes to allow uniform diffusion throughout the chamber,

What is claimed is:

1. A dual face shower head magnetron, comprising:
   a) a pair of face plates, each plate having a plurality of holes for transporting a gas therethrough, said face places being electrically insulted from each other and forming an interior space therebetween;
   b) a means for supporting said face plates in a position essentially parallel to each other to form the interior space, said supporting means being electrically insulated from said face plates;
   c) at least one magnet supported in the interior space, said at least one magnet being electrically insulted from said face plates and said means for supporting said face plates;
   d) means for introducing gas into the interior space and out through the plurality of holes in said face plates in a manner such that the flow rate of the gas through each hole is substantially the same;
   e) means for providing electrical power to at least one of said face plates; wherein the interior space is essentially gas tight except for the plurality of holes and said means for introducing gas.

2. An electrode according to claim 1, wherein said at least one magnet comprises multiple magnets positioned with like magnetic poles facing in substantially the same direction and positioned at a distance such that each magnet creates its own closed loop ExB drift path.

* * * * *

UNITED STATES PATENT AND TRADEMARK OFFICE
CERTIFICATE OF CORRECTION

PATENT NO. : 6,390,020 B1
DATED : May 21, 2002
INVENTOR(S) : Ing-Feng Hu and Jeffrey R. Dykhouse It is certified that error appears in the above-identified patent and that said Letters Patent is hereby corrected as shown below:

<u>Title page, Item [54] and Column 1, lines 1-3,</u>
Insert -- A -- between "COATING" and "SUBSTRATE" to read: -- DUAL FACE SHOWER HEAD MAGNETRON, PLASMA GENERATING APPARATUS AND METHOD OF COATING A SUBSTRATE --.

<u>Column 8,</u>
Lines 35 and 42, delete "insulted", and insert -- insulated -- therefor.
Line 53, delete "electrode" and insert -- magnetron -- therefor.

Signed and Sealed this

Twenty-ninth Day of October, 2002

Attest:

JAMES E. ROGAN
Attesting Officer
Director of the United States Patent and Trademark Office